United States Patent [19]
Hattori et al.

[11] Patent Number: 5,427,057
[45] Date of Patent: Jun. 27, 1995

[54] SELF-CLAMPING HOLDER FOR POLYSILICON ROD USED IN FLOATING-ZONE SINGLE-CRYSTAL GROWTH METHOD

[75] Inventors: Michiaki Hattori, Jyoetsu; Keiichi Nakazawa, Niigata, both of Japan

[73] Assignee: Shin-Etsu Handotai Co., Ltd., Tokyo, Japan

[21] Appl. No.: 282,420

[22] Filed: Jul. 29, 1994

Related U.S. Application Data

[63] Continuation of Ser. No. 974,647, Nov. 12, 1992, abandoned.

Foreign Application Priority Data

Nov. 28, 1991 [JP] Japan .................. 3-341987

[51] Int. Cl.[6] .......................................... C30B 13/14
[52] U.S. Cl. .................... 117/220; 117/221; 117/49
[58] Field of Search ............... 117/220, 221, 49; 269/204, 229, 231, 234

[56] References Cited

U.S. PATENT DOCUMENTS

| | | | |
|---|---|---|---|
| Re. 31,993 | 10/1985 | Wesch | 269/139 |
| 3,191,924 | 6/1965 | Haus | 422/250 |
| 3,547,428 | 12/1970 | Vogel | 269/97 |
| 3,592,937 | 7/1971 | Emeis | 422/250 |
| 3,901,499 | 8/1975 | Sporrer | 422/250 |
| 4,157,819 | 6/1979 | Meyer | 269/231 |
| 4,469,362 | 9/1984 | Schaarschmidt | 269/233 |

FOREIGN PATENT DOCUMENTS

| | | | |
|---|---|---|---|
| 2288821 | 5/1976 | France | 269/231 |
| 2322969 | 11/1974 | Germany | |
| 2853414 | 6/1980 | Germany | |

*Primary Examiner*—Robert Kunemund
*Attorney, Agent, or Firm*—Nikaido Marmelstein Murray & Oram

[57] ABSTRACT

A self-clamping holder capable of holding a polysilicon rod using the weight of the polysilicon rod is disclosed. The holder includes a generally cup-shaped adapter having an open end facing downward, and at least three clamp jaws rotatably mounted on the adapter adjacent to the open end and circumferentially spaced at equal angular intervals for clamping or gripping an end of the polysilicon rod received in the adapter. The clamp jaws have arcuate cam surfaces disposed interiorly of the adapter and profiled such that a radius of curvature of the cam surfaces gradually increases as the clamp jaws turn in a downward direction of the adapter. With this construction, the polysilicon rod is firmly gripped by the clamp jaws against detachment from the holder. The clamp jaws produces a clamping force acting on the peripheral surface of the polysilicon rod and distributed uniformly in the circumferential direction of the polysilicon rod. With this clamping force, the polysilicon rod is held in such a vertical position that a longitudinal central axis of the polysilicon rod is aligned with an axis of rotation of the adapter while the polysilicon rod is rotating.

7 Claims, 2 Drawing Sheets

SELF-CLAMPING HOLDER FOR POLYSILICON ROD USED IN FLOATING-ZONE SINGLE-CRYSTAL GROWTH METHOD

This application is a continuation of application Ser. No. 07/974,647 filed Nov. 12, 1992, now abandoned.

BACKGROUND OF THE INVENTION

1. Field of the Invention

The present invention relates generally to an apparatus for producing a semiconductor single-crystal silicon grown by the floating-zone (FZ) method in which a polysilicon rod is converted into a single-crystal ingot by passing a molten zone, formed by heating a part of the polysilicon rod with a high-frequency induction heating coil, from one end of the polysilicon rod to the other. More particularly, it relates to a self-clamping holder which is able to hold the polysilicon rod using the weight of the polysilicon rod.

2. Description of the Prior Art

In the production of a silicon single crystal grown by the FZ method, there has been used an apparatus which comprises a polysilicon rod holder attached to the lower end of a vertically movable upper drive shaft and disposed in a growth chamber, a seed crystal holder attached to the upper end of a vertically movable lower drive shaft and disposed in the growth chamber, and a high-frequency induction heating coil disposed within the growth chamber at an intermediate portion of the growth chamber. A polysilicon rod and a seed crystal are held by the polysilicon rod holder and the seed crystal holder, respectively. Then, one end of the polysilicon rod is melted down by heating with the high-frequency induction heating coil. The molten tip of the polysilicon rod is contacted and fused with the seed crystal, thus seeding the molten zone. The seeded molten zone is passed through the polysilicon rod by simultaneously moving down the polysilicon rod with the seed crystal while rotating the polysilicon rod relative to the high-frequency induction heating coil. As the zone travels the polysilicon rod, single-crystal silicon freezes at its end and grows as an extension of the seed crystal.

As shown in FIG. 3 of the accompanying drawings, the polysilicon rod holder 2 includes a generally cup-shaped adapter 8 made, in general, of stainless steel and secured by a screw 6 to the lower end of the upper drive shaft 4 with its open end facing downward, and a plurality (six to eight, in general) of clamp screws 12 threaded respectively through a plurality of threaded holes 10 formed in a lower portion of an annular side wall of the adapter 8 at equal angular intervals. Each of the clamp screws 12 has a heat-resistant presser plate 14 attached to a front end of the clamp screw 12, so that by tightening the respective clamp screws 12, a polysilicon rod P is gripped by the presser plates 14. Thus, the polysilicon rod P is held by the polysilicon rod holder 2. In general, the heat-resistant presser plates 14 are made of molybdenum which has a higher melting point than silicon.

When used in the production of a silicon single crystal grown by the FZ method, the apparatus having the conventional polysilicon rod holder shown in FIG. 3 has encountered the following problems.

(1) Accidental Detachment of Polysilicon Rod:

At the final stage of the FZ single-crystal growth process, the molten zone comes up to an upper end portion of the polysilicon rod P adjacent to the polysilicon rod holder 2. In this instance, since the temperature of the upper end portion of the polysilicon rod P reaches to 1000° C. or more, the holder 2 as a whole is heated at a high temperature due mainly to radiant heat emitted from the thus heated upper end portion of the polysilicon rod P. It occurs that due to thermal expansion, the clamping forces exerted by the respective clamp screws 12 on the polysilicon rod P become low, thus causing the polysilicon rod P to detach from the holder 2.

(2) Disqualified Silicon Single Crystal:

Due to the use of a plurality of clamp screws 12, it is very difficult to balance or equalize the clamping forces produced by the respective clamp screws. With this difficulty in making a force balance, the polysilicon rod P is likely to be held in such an inaccurate condition that a longitudinal central axis of the polysilicon rod P draws a circle when the polysilicon rod P held by the holder 2 is rotating. With the polysilicon rod thus held inaccurately, the FZ single-crystal growth process is difficult to achieve in a stable and reliable manner. Even if the FZ single-crystal growth process were carried out, the silicon single crystal would not be desirable qualitywise.

SUMMARY OF THE INVENTION

With the foregoing problems of the prior art in view, it is an object of the present invention to provide a polysilicon rod holder which is able to prevent a polysilicon rod from detaching from the holder at the final stage of the FZ single-crystal growth process, and which is capable of holding the polysilicon rod firmly and stably with a clamping force uniformly distributed over the circumferential direction of the polysilicon rod so that a longitudinal central axis of the polysilicon rod does not draw a circle when the polysilicon rod is being rotated during the FZ single-crystal growth process.

A more specific object of the present invention is to provide a self-clamping holder which is capable of holding a polysilicon rod by using the weight of the polysilicon rod.

A polysilicon rod holder according to the present invention includes a generally cup-shaped adapter adapted to be attached to the lower end of a rotatable and longitudinally movable vertical drive shaft of a single crystal growing apparatus, with an open end of the adapter facing downward. The adapter has an annular side wall defining a space for receiving therein an end of a polysilicon rod. At least three clamp jaws are rotatably mounted on the annular side wall of the adapter and disposed in symmetric relation to one another about a central axis of the adapter, so as to grip the end of the polysilicon rod by using the weight of the polysilicon rod. The clamp jaws have arcuate cam surfaces disposed interiorly of the annular side wall and frictionally engageable with a peripheral surface of the polysilicon rod. The arcuate cam surfaces are profiled such that a radius of curvature of the arcuate cam surfaces gradually increases as the clamp jaws turn in a downward direction of the adapter.

Preferably, the holder further includes a presser plate movably mounted within the space of the adapter for causing the clamp jaws to turn in the downward direction of said adapter, thereby increasing a clamping force of the clamp jaws.

With this construction, when a polysilicon rod is to be attached to the holder, an upper end of the polysilicon rod is forced into the space of the adapter. In this instance, the clamp jaws are turned in the upward direction of the adapter by means of the polysilicon rod so that the polysilicon rod can be smoothly received in the space of the adapter. Then, an upward force is released from the polysilicon rod whereupon the polysilicon rod is allowed to drop by its own weight (or by the force of gravity). In this instance, due to friction engagement between the cam surfaces of the respective clamp jaws and the peripheral surface of the polysilicon rod, the clamp jaws are turned in the downward direction of the adapter. Since the radius of curvature of the cam surfaces increases with the amount of movement of the clamp jaws in the downward direction of the adapter, the clamp jaws produces a clamping force acting on the peripheral surface of the polysilicon rod. The clamping force increases with the downward movement of the polysilicon rod, so that the polysilicon rod is eventually held on the holder with its upper end firmly gripped by the clamp jaws.

Many other advantages and features of the present invention will become manifest to those skilled in the art upon making reference to the detailed description and the accompanying sheets of drawings in which a preferred structural embodiment incorporating the principles of the present invention is shown by way of illustrative example.

DETAILED DESCRIPTION OF THE INVENTION

Figure 1:
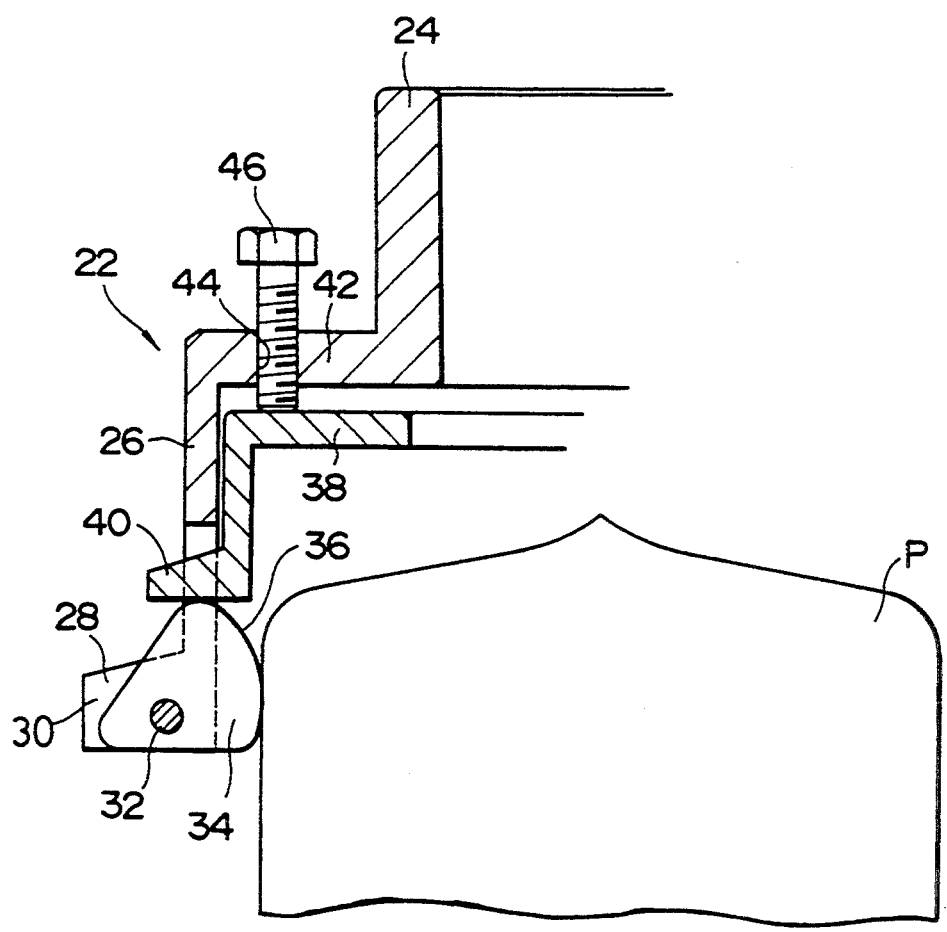
FIG. 1 is a diagrammatical cross-sectional view of a polysilicon rod holder according to the present invention.

FIG. 1 shows a polysilicon rod holder 22 according to the present invention. The holder 22 is incorporated in an apparatus for producing a silicon single crystal grown by a floating-zone (FZ) method. The holder 22 includes a generally cup-shaped adapter 24 adapted to be attached by a suitable fastener such as a screw (not shown) to the lower end of an upper drive shaft (not shown) of the apparatus, with an open end of the cup-shaped adapter 24 facing downward.

Figure 2:
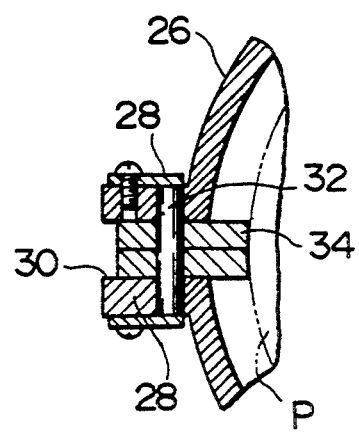
FIG. 2 is a horizontal cross-sectional view showing a main portion of the polysilicon rod holder.
Figure 3:
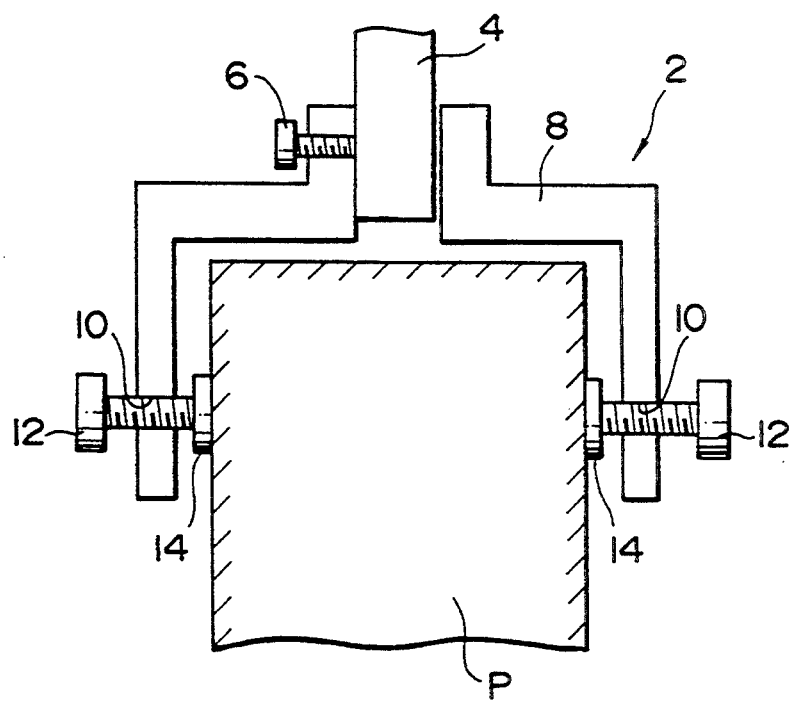
FIG. 3 is a diagrammatical cross-sectional view of a conventional polysilicon rod holder.

The adapter 24 includes an annular side wall 26 defining a space for receiving an upper end of a polysilicon rod P. The annular side wall 26 has at least three axial grooves 30 (only one shown) extending from the lower end to an intermediate portion of the side wall 26 for attachment of the corresponding number of clamp jaws 34 to the adapter 24. The axial grooves 30 are circumferentially spaced at equal angular intervals. Each of the axial grooves 30 is partly defined by a pair of parallel spaced support wings 28 and 28 (FIG. 2) projecting radially outwardly from the lower end of the annular side wall 26. As shown in FIG. 2, each of the clamp jaws 34 is rotatably mounted in tandem relation on a shaft 32 extending between a corresponding one of the at least three pairs of support wings 28, 28.

As shown in FIG. 1, the clamp jaw 34 has an arcuate cam surface 36 frictionally engageable with a peripheral surface of a polysilicon rod P for holding the polysilicon rod P on the holder 22. The arcuate cam surface 36 draws a part of a circle having a center which is eccentric to, or off-center from, a longitudinal central axis of the shaft 32. The arcuate cam surface 36 is profiled such that the radius of curvature of the arcuate cam surface 36 gradually increases as the clamp jaws 34 turns about the shaft 32 in a downward direction of the adapter 24, with the cam surface 36 disposed interiorly of the annular side wall 26 of the adapter 24.

The clamp jaws 34 are made of a heat-resisting material, such as molybdenum or tungsten, which is able to withstand a high temperature exceeding 1000° C. which is experienced when the polysilicon rod P is heated during the FZ single-crystal growth process. Preferably, the cam surface 36 of each clamp jaw 34 is a roughened surface formed by knurling, for example, and having a large coefficient of friction. The cam surface 36 thus formed has an anti-slip property which will increases the reliability of holding operation of the holder 22.

A presser plate 38 is movably disposed in the adapter 24 and has at least three, radially outwardly projecting presser feet 40 received in the corresponding grooves 30 in the adapter 24 and disposed above the corresponding clamp jaws 34. The presser feet 40 are normally held on the clamp jaws 34. At least one presser screw 46 is threaded through a threaded hole 44 formed in an upper wall 42 of the adapter 24. The presser screw 46 has a forward end engageable with an upper surface of the presser plate 38. By turning the presser screw 46 in the forward or tightening direction (downward direction in FIG. 1), the presser plate 24 is lowered by the presser screw 46 so that the presser feet 40 of the presser plate 38 force the clamp jaws 34 to turn about the shafts 32 in the downward direction of the adapter 24.

As described above, the number of the clamp jaws 34 are at least three. Six or eight clamp jaws 34 are particularly preferable. In order to hold the polysilicon rod P stably and accurately, the clamp jaws 34 are circumferentially spaced at equal angular intervals. In other words, the clamp jaws 34 are disposed in symmetric relation to one another about an axis of rotation of the adapter 24.

The polysilicon rod holder 22 of the foregoing construction operates as follows.

When a polysilicon rod P is to be held on the holder 22, the presser screw 46 is turned in the reverse or loosening direction (upward direction in FIG. 1) so that the presser plate 38 and its presser feet 40 move upwardly away from the clamp jaws 34. Thus, the clamp jaws 34 are freely rotatable about the respective shafts 32. Then, an upper end of the polysilicon rod P is forced upwardly into the space of the adapter 24 through the open end adjacent to which the clamp jaws 34 are disposed. In this instance, the clamp jaws 34 turn in the upward direction of the adapter 24 without obstructing upward movement of the polysilicon rod P. Thus, the polysilicon rod P can be smoothly received in the space of the adapter 24.

Then, an upward force is released from the polysilicon rod P, the polysilicon rod P is allowed to come down by its own weight (by the force of gravity). In this instance, however, due to frictional engagement between the peripheral surface of the polysilicon rod P and the cam surfaces 36 of the respective clamp jaws 34, the clamp jaws 34 are caused to turn about the shafts 32 in the downward direction of the adapter 24. Since the radius of curvature of the cam surfaces 36 increases with the amount of angular movement of the clamp jaws 34 in the downward direction of the adapter 24, the clamp jaws 34, as they move downward, produce a clamping force tending to grip the polysilicon rod P by and between the cam surfaces 36. Thus, the polysilicon rod P is held on the holder 22 with its upper end firmly gripped by the clamp jaws 34.

Since the clamping force produced by the clamp jaws 34 increases with the weight of the polysilicon rod P, if the polysilicon rod P is once held on the holder 22, detachment or accidental drop of the polysilicon rod P never occurs during the FZ single-crystal growth process.

Thereafter, the presser screw 46 is turned in the forward or tightening direction to lower the presser plate 38. With this downward movement of the presser plate 38, the presser feet 40 of the presser plate 38 force the clamp jaws 34 to further turn in the downward direction of the adapter 24. Thus, the clamping force of the clamp jaws 34, which is exerted on the peripheral surface of the polysilicon rod P, is enhanced with the result that the reliability of holding operation of the holder 22 is increased greatly.

It may be appreciated from the foregoing description that since a clamping force exerted by the clamp jaws 34 is produced by the weight of the polysilicon rod P, it is no longer necessary to provide clamp screws in order to hold the polysilicon rod P on the holder. In addition, the clamp jaws 34 are freely rotatable about the shafts 32, so that it is possible to produce an adequate clamping force even when the adapter 24 is somewhat deformed.

When the polysilicon rod P is heated at a high temperature exceeding 1000° C. at the final stage of the FZ single-crystal growth process (namely, when a molten zone comes up to an upper end portion of the polysilicon rod P adjacent to the holder 22), the adapter 24 and the presser plate 38 tend to deform due to thermal expansion. If such thermal deformation takes place, the clamp jaws 34 are able to kept an adequate clamping force without reduction. Thus, the polysilicon rod P is held firmly against detachment.

Furthermore, if an upper end of the polysilicon rod P is once received accurately in the adapter 24 from the lower end thereof, clamping forces exerted by the respective clamp jaws 34 readily balance with each other and hence are distributed uniformly over the peripheral surface of the polysilicon rod P. With this uniformly distributed clamping forces, it is possible to hold the polysilicon rod P stably and accurately in such a vertical position that a longitudinal central axis of the polysilicon rod P is in alignment with the axis of rotation of the adapter 24 and, hence, does not draw a circle while the polysilicon rod P is being rotated during the FZ single-crystal growth process.

It is obvious that the relation between the diameter of a polysilicon rod P to be held on the holder 22 and the position of the clamp jaws 34 are determined such that at least the cam surfaces 36 of the clamp jaws 36 are frictionally engageable with a peripheral surface of the polysilicon rod P.

As described above, the holder according to the present invention is able to hold a polysilicon rod by using the weight of the polysilicon rod. The holder thus constructed is free from clamp screws which may bring about various problems described above with respect to the conventional polysilicon rod holder. According to the holder of the present invention, the clamping force acting on the polysilicon rod is uniformly distributed over the circumferential direction of the polysilicon rod. It is, therefore, possible to hold the polysilicon rod in such a vertical position that a longitudinal central axis of the polysilicon rod does not draw a circle when the polysilicon rod is rotating. Furthermore, even if the polysilicon rod undergoes thermal expansion, a reduction of the clamping force does not take place. It is, therefore, possible to prevent the polysilicon rod from detaching from the holder at the final stage of the FZ single-crystal growth process.

Obviously, various modifications and variations of the present invention are possible in the light of the above teaching. It is therefore to be understood that within the scope of the appended claims the invention may be practiced otherwise than as specifically described.

What is claimed is:

1. A polysilicon rod holder for use in an apparatus for producing a silicon single crystal grown by a floating-zone method, the apparatus having a vertical drive shaft movable longitudinally while rotating about its own axis, said polysilicon rod holder comprising:

a generally cup-shaped adapter adapted to be attached to a lower end of the vertical drive shaft with an open end facing downward, said adapter having an annular side wall defining a space for receiving therein an end of a polysilicon rod;

at least three clamp jaws rotatably mounted on said annular side wall of said adapter and disposed in symmetric relation to one another about a central axis of said adapter, so as to grip the end of the polysilicon rod by using the weight of the polysilicon rod, said clamp jaws having arcuate cam surfaces disposed interiorly of said annular side wall and said cam surfaces directly frictionally engageable with a peripheral surface of the polysilicon rod, said arcuate cam surfaces being profiled such that a radius of curvature of said arcuate cam surfaces gradually increases as said clamp jaws turn in a downward direction of said adapter;

wherein said annular side wall has a lower end adjacent to said open end of said adapter and an upper end remote from said open end of said adapter, said annular side wall comprises at least three axial grooves extending from said lower end toward said upper end of said annular side wall, each of said axial grooves receiving respectively therein one of said at least three clamp jaws, and at least three pairs of parallel spaced support wings projecting radially outwardly from said lower end of said annular side wall, each of said pairs defining a part of one of said at least three axial grooves, respectively, each of said clamp jaws being rotatably mounted on a shaft extending between a corresponding one of said at least three pairs of support wings;

a presser plate, movably mounted within said space for causing said clamp jaws to turn in said downward direction of said adapter, said presser plate having at least three presser feet each received in a corresponding one of said at least three axial grooves and normally held on a corresponding one of said at least three clamp jaws; and means for moving said presser plate in said downward direction of said adapter.

2. A polysilicon rod holder according to claim 1, wherein said adapter has an upper wall closing said upper end of said annular side wall, said upper wall having a threaded hole, said moving means comprising a presser screw threaded through said threaded hole and having a front end engageable with said presser plate.

3. A polysilicon rod holder for use in an apparatus for producing a silicon single crystal grown by a floating-zone method, the apparatus having a vertical drive shaft movable longitudinally while rotating about its own axis, said polysilicon rod holder comprising:
- a generally cup-shaped adapter adapted to be attached to a lower end of the vertical drive shaft with an open end facing downward, said adapter having an annular side wall defining a space for receiving therein an end of a polysilicon rod;
- at least three clamp jaws rotatably mounted on said annular side wall of said adapter and disposed in symmetric relation to one another about a central axis of said adapter, so as to grip the end of the polysilicon rod by using the weight of the polysilicon rod, said clamp jaws having arcuate cam surfaces disposed interiorly of said annular side wall and said cam surfaces directly frictionally engageable with a peripheral surface of the polysilicon rod, said arcuate cam surfaces being profiled such that a radius of curvature of said arcuate cam surfaces gradually increases as said clamp jaws turn in a downward direction of said adapter; and
- a presser plate movably mounted within said space of said adapter for causing said clamp jaws to turn in said downward direction of said adapter.

4. A polysilicon rod holder according to claim 3, wherein said presser plate has at least three presser feet each normally held on a corresponding one of said at least three clamp jaws, and said rod holder comprises means for moving said presser plate in said downward direction of said adapter.

5. A polysilicon rod holder according to claim 4, wherein said adapter has an upper wall closing said upper end of said annular side wall, said upper wall having a threaded hole, said moving means comprising a presser screw threaded through said threaded hole and having a front end engageable with said presser plate.

6. A polysilicon rod holder for use in an apparatus for producing a silicon single crystal grown by a floating-zone method, the apparatus having a vertical drive shaft movable longitudinally while rotating about its own axis, said polysilicon rod holder comprising:
- a generally cup-shaped adapter adapted to be attached to a lower end of the vertical drive shaft with its open end facing downward, said adapter having an annular side wall defining a space for receiving therein an end of a polysilicon rod; and
- at least three clamp means, mounted on said annular side wall of said adapter and disposed in symmetric relation to one another about a central axis of said adapter, for gripping the end of the polysilicon rod along a peripheral surface thereof in conjunction with each other by using the weight of the polysilicon rod, each of said clamp means including a clamp jaw rotatably connected to said annular side wall and which has an arcuate cam surface directed interiorly of said annular side wall and said cam surface directly frictionally engageable with the peripheral surface of the polysilicon rod, said arcuate cam surface of each clamp jaw being profiled such that a radius of curvature of said arcuate cam surface gradually increases as said clamp jaw turns in a downward direction relative to said adapter;
- a presser plate movably mounted within said space of said adapter for causing said clamp jaws to turn in said downward direction of said adapter; and
- wherein said presser plate has at least three presser feet each normally held on a corresponding one of said at least three clamp jaws, and said rod holder comprises means for moving said presser plate in said downward direction of said adapter.

7. A polysilicon rod holder according to claim 6, wherein said adapter has an upper wall closing said upper end of said annular side wall, said upper wall having a threaded hole, said moving means comprising a presser screw threaded through said threaded hole and having a front end engageable with said presser plate.

* * * * *